United States Patent [19]

Kaga et al.

[11] Patent Number: 4,918,502
[45] Date of Patent: Apr. 17, 1990

[54] SEMICONDUCTOR MEMORY HAVING TRENCH CAPACITOR FORMED WITH SHEATH ELECTRODE

[75] Inventors: Toru Kaga, Urawa; Shinichiro Kimura, Hachioji; Hideo Sunami, Nishitama, all of Japan

[73] Assignee: Hitachi, Ltd., Tokyo, Japan

[21] Appl. No.: 123,235

[22] Filed: Nov. 20, 1987

[30] Foreign Application Priority Data

Nov. 28, 1986 [JP] Japan .............................. 61-281722
Nov. 28, 1986 [JP] Japan .............................. 61-281716

[51] Int. Cl.[4] ........................................ H01L 29/78
[52] U.S. Cl. ..................................... 357/23.6; 357/55
[58] Field of Search .................. 357/23.6, 55, 41, 51

[56] References Cited

U.S. PATENT DOCUMENTS

| 4,728,623 | 3/1988 | Lu | 357/23.6 |
| 4,791,610 | 12/1988 | Takemae | 357/23.6 |
| 4,794,434 | 12/1988 | Pelley | 357/55 |
| 4,803,535 | 2/1989 | Taguchi | 357/23.6 |

FOREIGN PATENT DOCUMENTS

| 0177066 | 4/1986 | European Pat. Off. | 357/23.6 |
| 0234891 | 9/1987 | European Pat. Off. | 357/23.6 |
| 60-47458 | 3/1985 | Japan | 357/23.6 |
| 61-199657 | 9/1986 | Japan | 357/23.6 |
| 61-287258 | 12/1986 | Japan | 357/23.6 |
| 62-79659 | 4/1987 | Japan | 357/55 |

OTHER PUBLICATIONS

IEDM Technical Digest, Dec. 1986, pp. 136–139, by Taguchi et al.

Primary Examiner—Andrew J. James
Assistant Examiner—Mark Prenty
Attorney, Agent, or Firm—Antonelli, Terry & Wands

[57] ABSTRACT

The present invention relates to a highly packaged semiconductor memory, and more particularly to a memory cell having a trench capacitor for use in a CMOS memory. The present invention discloses a semiconductor memory employing memory cells each constructed of a trench type charge storage capacitor formed within a substrate, and a switching transistor; one electrode of the capacitor having a sheath-shaped structure which is electrically continuous with the Si substrate at a bottom of a groove and whose sideward periphery is covered with an insulator, the other electrode of the capacitor having a part which is buried inside the sheath electrode and another part which is electrically connected with an impurity diffused layer to function as a source region of the transistor. Further, a structure in which a voltage of $\frac{1}{2} V_{cc}$ can be applied to a plate electrode of a memory cell having a trench capacitor is disclosed.

25 Claims, 15 Drawing Sheets

SEMICONDUCTOR MEMORY HAVING TRENCH CAPACITOR FORMED WITH SHEATH ELECTRODE

BACKGROUND OF THE INVENTION

The present invention relates to a MOS DRAM. More particularly, it relates to a trench capacitor cell structure well suited to microminiaturization and also to a method of applying a voltage thereto.

DRAMs have realized a rise in the density of integration to about four times in a matter of three years, wherein the mainstream thereof has already shifted from 64 k-bits to 256 k-bits. Even DRAMs of 1 M-bits will soon be mass-produced. The heightened integration has been achieved chiefly by the scaling-down of device sizes. The decrease of a storage capacitance attendant upon the scaling-down, however, has posed the problems of degradation in a signal-to-noise ratio, storage charge destruction ascribable to alpha-particles, and so on. As measures to be taken against these problems, a large number of trench capacitor cell designs have been published. Among them, one proposed by Shimizu and 9 others in "BSD Cell for Megabit-class DRAM"; the Institute of Electronics and Communication Engineering of Japan, Group for the Research of Semiconductors and Transistors, SSD86-2, p. 9, is immune against alpha-particles and is considered promising. This cell has a structure shown in FIG. 1. In this cell, a charge storage node 24 is formed inside a trench provided in the surface of a semiconductor, in a manner to be surrounded with a capacitor insulator 23. That is, storage charges are insulated from the semiconductor substrate substantially perfectly. Therefore, even when electrons and holes are generated within the semiconductor substrate by the cause of alpha-particles, they seldom gather to the storage node. Accordingly, the cell has the feature that the storage charge destruction is less prone to occur.

Although the memory cell structure has the excellent feature as described above, it is not suited to CMOS (Complementary Metal Oxide Semiconductor) devices which form the mainstream of present-day LSI. More specifically, a thin $p^-$ epitaxial layer 22 is indispensable to this memory cell structure. Nevertheless, this part becomes a high-concentration-p layer because $p^+$ impurity atoms diffuse upwards in a high temperature process during the formation of wells required for the CMOS device.

As stated above, in the CMOS implementation, it has been technically difficult to employ a $p^-$-on-$p^+$ type semiconductor substrate having a thin epitaxial layer.

SUMMARY OF THE INVENTION

The prior art described above has had the problem that it is very difficult of matching with the CMOS implementation which is the trend of LSI's at present.

An object of the present invention is to provide a memory cell structure which permits the CMOS implementation and which can also realize the reduction of soft errors against alpha-particles and the reduction of a leakage current between closely positioned cells as have hitherto been the themes of a trench capacitor cell.

As regards the memory cell structure shown in FIG. 1, the aforementioned object is accomplished in such a way that one electrode of a storage capacitor made of the $p^+$ substrate is changed into a sheath electrode which is surrounded with an insulator and which has a bottom in contact with a Si substrate.

Since the sheath electrode is electrically continuous to the semiconductor substrate at the bottom of a trench, the same electrical operation as that of the memory cell in FIG. 1 can be realized using this electrode as one electrode for the storage capacitor. In addition, the memory cell employing the sheath electrode does not require the $p^+$ semiconductor substrate. Therefore, even when the substrate is subjected to the high temperature process during the formation of the wells, the problem of the increase of the impurity concentration of the substrate surface as in the memory cell of FIG. 1 is no longer a concern. Accordingly, the CMOS implementation is easy. Besides, since the charge storage portion of a capacitor is insulated from the substrate substantially perfectly, storage-charge leakage between adjacent cells does not occur. Further, the proposed structure is immune against soft errors attributed to alpha-particles.

Meanwhile, since the prior art uses the semiconductor substrate as the plate electrode of the trench capacitor, a potential on the order of 0 V to −3 V is usually applied to the plate electrode in an operation in a case where a MOS transistor of, for example, n-channel is employed for a memory cell. In general, the potential of the other storage electrode of the capacitor is 0 V or 5 V ($V_{cc}$). Therefore, a potential difference of 5 V at the maximum is applied to the capacitor insulator of the trench capacitor in the prior art (for the plate potential of 0 V, and if the plate potential is −3 V, a maximum potential difference of 8 V is applied to the insulator). On account of this great voltage, the insulator of the trench capacitor in the prior art has been difficult to make thinner than about 10 nm. On the other hand, when $\frac{1}{2} V_{cc}$, namely, 2.5 V can be applied to the plate electrode, the potential difference to be applied to the insulator of the capacitor can be reduced to 2.5 V at the maximum. Therefore, in the case of employing an insulator of equal thickness, the lifetime of the capacitor insulator can be remarkably prolonged. To the contrary, in the case of setting the lifetime of the insulator to be equal, the thickness of the insulator can be reduced, and accordingly, a remarkable increase (up to 2 times or so) in capacitance can be realized.

It is accordingly another object of the present invention to provide a new cell structure in which $\frac{1}{2} V_{cc}$ can be applied to a plate electrode.

The potential of $\frac{1}{2} V_{cc}$ is applied to several plate electrodes led out on a substrate, whereby all plate electrodes can be biased with the potential of $\frac{1}{2} V_{cc}$ through diffused layers within the substrate which are electrically continuous to the led-out plate electrodes. Thus, it is possible to realize a charge storage capacitor cell of the new trench type whose plate voltage is $\frac{1}{2} V_{cc}$.

The aforementioned object can be accomplished in such a way that a plate electrode is buried in a groove through an insulator and that any desired potential is applied to this plate electrode. More specifically, at the bottom of the groove, the plate electrode is electrically continued with respect to a diffused layer which is formed within a substrate and which has a conductivity type opposite to that of the substrate. The diffused layer is formed so as to extend across at least two adjacent grooves, whereby the plate electrodes formed within these grooves are held at an identical potential. Some of the plate electrodes are led out to the surface of the substrate, and a voltage is applied thereto, whereby this voltage can be applied to all the plate electrodes.

These and other objects and many of the attendant advantages of this invention will be readily appreciated as the same becomes better understood by reference to the following detailed description when considered in connection with the accompanying drawings.

DETAILED DESCRIPTION OF THE INVENTION

Figure 1:
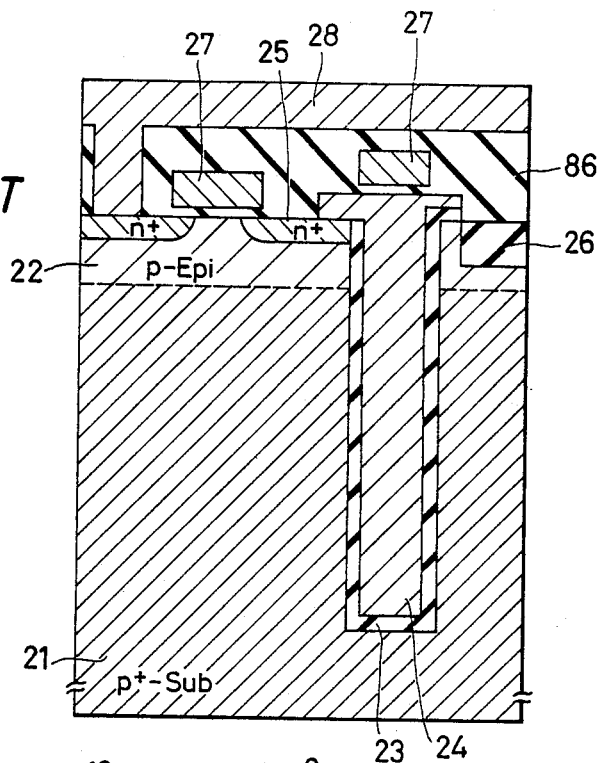
FIG. 1 is a sectional view for explaining a prior art.
Figure 2:
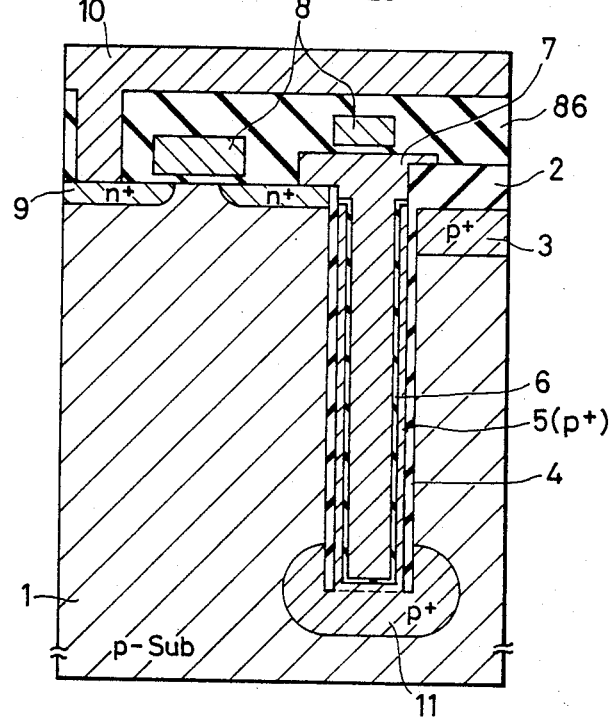
FIG. 2 and FIGS. 3A-3H are sectional views for explaining an embodiment of the present invention.

Now, a first embodiment for realizing the semiconductor memory of the present invention shown in FIG. 2 will be described with reference to FIGS. 3A-3H.

Figure 3A:
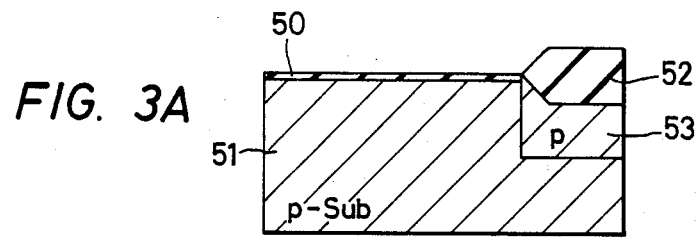
Figure 3B:
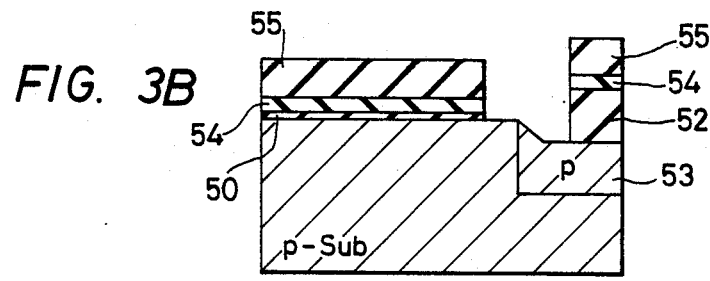
Figure 3C:
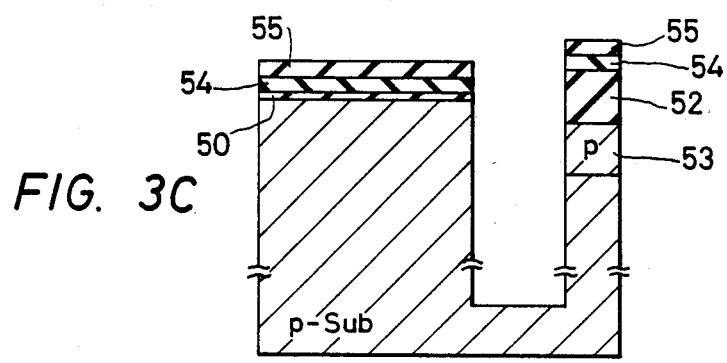
Figure 3D:
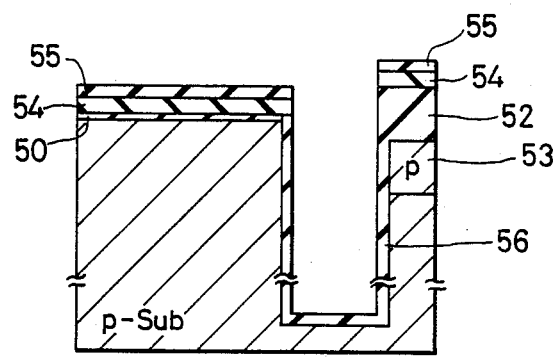
Figure 3E:
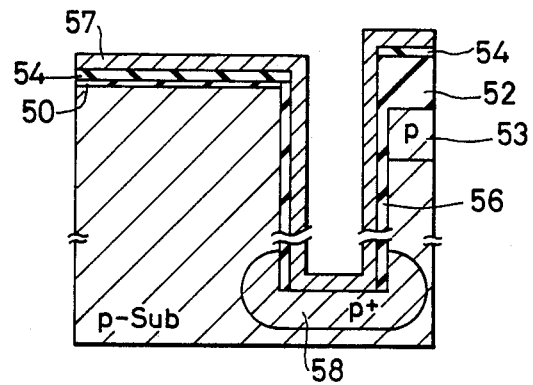
Figure 3F:
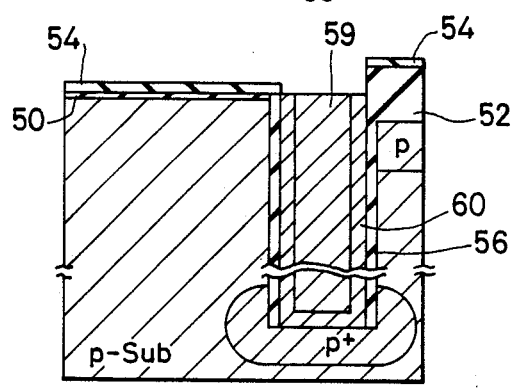

In order to realize the semiconductor memory of the present invention, a p-type silicon substrate 51 is employed as shown in FIG. 3A. An insulator 52 for an isolation region is formed. Thereafter, in order to form an Si groove, as illustrated in FIG. 3B, silicon nitride 54 and silicon dioxide 55 are deposited by chemical vapor deposition, and the parts of the silicon nitride and silicon dioxide films on a region to be formed with the silicon groove are etched using photolighography and dry etching. Subsequently, using the silicon dioxide film as a mask, the groove of a desired depth (for example, 4 μm) is formed in the silicon substrate by anisotropic dry etching (FIG. 3C). Next, the interior of the silicon groove is oxidized to form silicon dioxide 56 (FIG. 3D). Thereafter, only the parts of the silicon dioxide at the surface of the substrate and at the bottom of the groove are etched by anisotropic dry etching, polycrystalline Si 57 is deposited by chemical vapor deposition, and boron is diffused into the polycrystalline Si 57 and silicon groove bottom 58 by vapor phase diffusion (FIG. 3E). Thus, the polycrystalline Si and the silicon substrate are electrically continued. In the structure of FIG. 3E, it is needless to say that the silicon dioxide film 56 formed by thermal oxidation can be replaced with an insulator such as $SiO_2$ deposited by chemical vapor deposition, $Si_3N_4$ deposited by chemical vapor deposition, or a composite film $SiO_2/Si_3N_4/SiO_2$ of these insulators. Subsequently, as illustrated in FIG. 3F, the groove is filled up with a photoresist 59, and the polycrystalline Si outside the groove is etched, thereby to form a sheath electrode 60. After removing the photoresist, the surface of the sheath electrode is formed with a capacitor insulator 61 by oxidation or chemical vapor deposition.

Figure 3G:
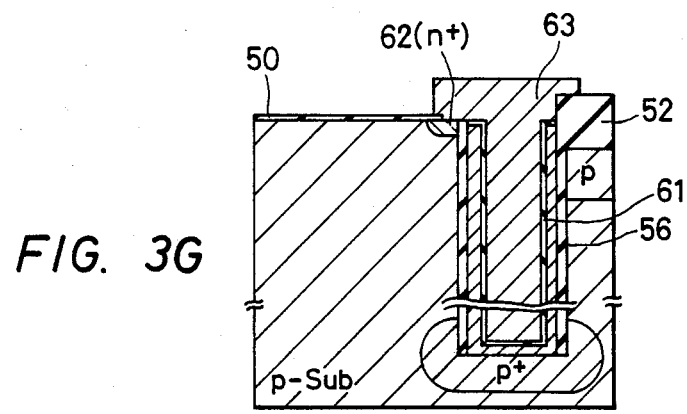
Figure 3H:
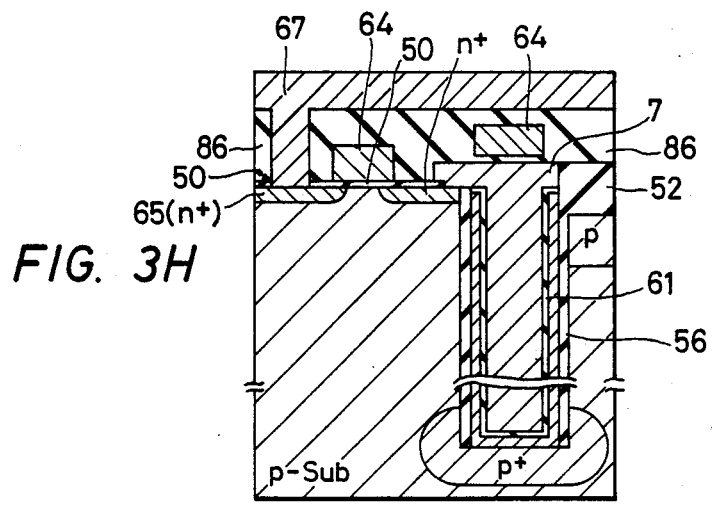

The silicon nitride film 54 on the surface of the substrate is removed by wet etching which uses phosphoric acid, and the part of a silicon dioxide film 50 near the top of the groove is removed by photolithography and wet etching, whereupon a contact portion 62 is formed. Thereafter, polycrystalline Si is deposited by chemical vapor deposition, phosphorus is diffused by vapor phase diffusion, and a storage electrode or node 63 is formed using photolithography and dry etching (FIG. 3G). Thereafter, gate electrodes 64 are formed, source and drain impurity regions ($n^+$ diffused layers 65) are formed by ion implantation, and phosphosilicate glass 66, 86 is deposited by chemical vapor deposition. A contact hole is formed, and Al wiring 67 is laid. Then, the semiconductor memory having the sheath electrode as shown in FIG. 3H is completed.

Figure 7:
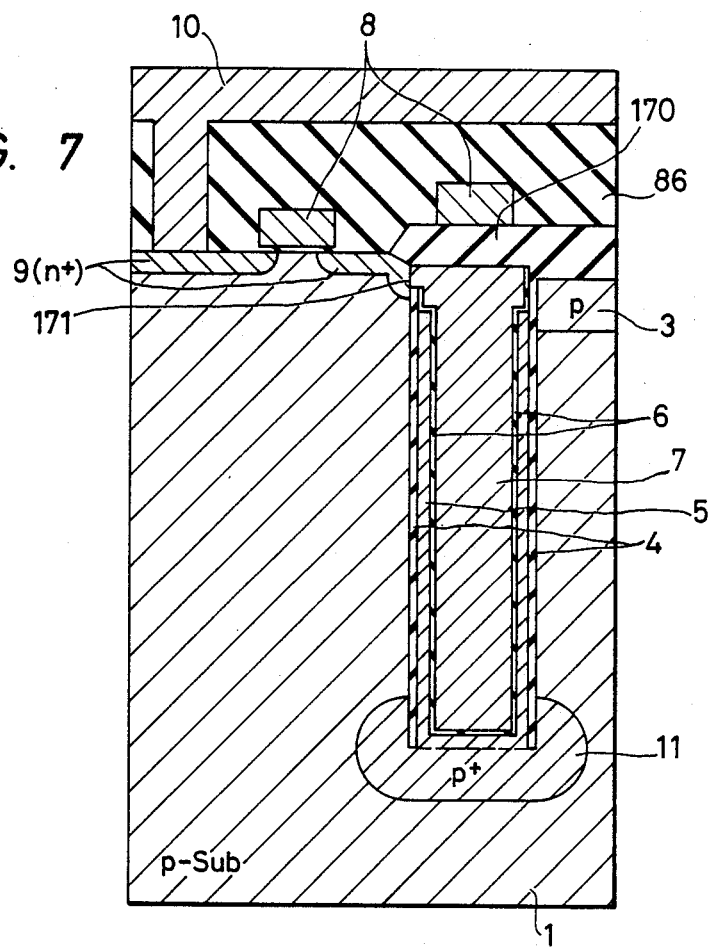

Another embodiment of the semiconductor memory of the present invention is shown in FIG. 7. Except that a sidewall contact formed at a position 171 at the top part of a groove is employed for the electrical connection between the storage electrode 7 of a capacitor and the $n^+$ diffused layer 9 of a transistor, the present embodiment has the same structure as that of the embodiment in FIG. 2 and also exhibits the same electrical characteristics as those of the preceding embodiment. The present embodiment utilizes the sidewall contact and therefore dispenses with a planar occupation area for the connection. Accordingly, it has the effect that the plan layout area of the device is reduced.

Figure 8A:
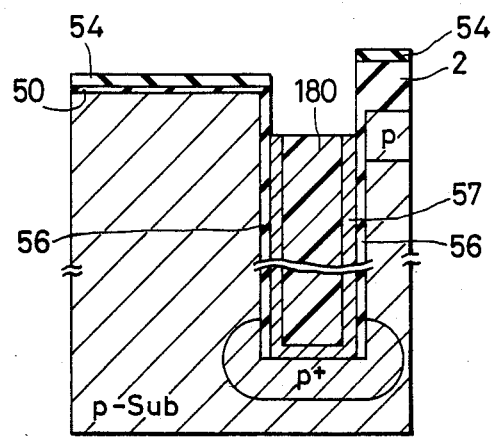
Figure 8B:
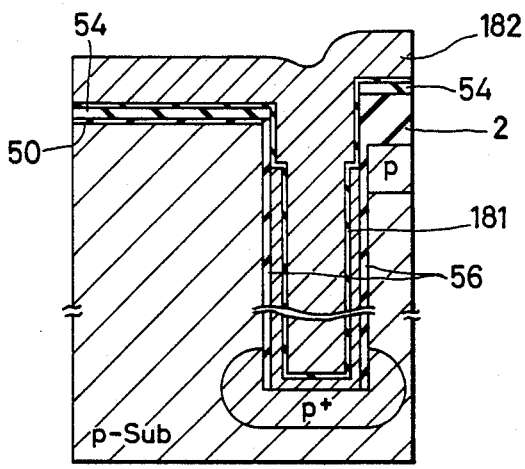
Figure 8C:
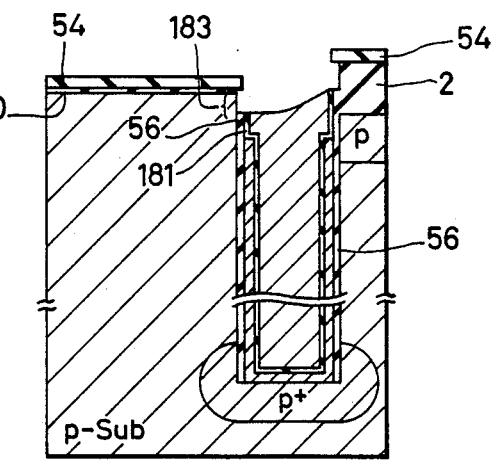
Figure 8D:
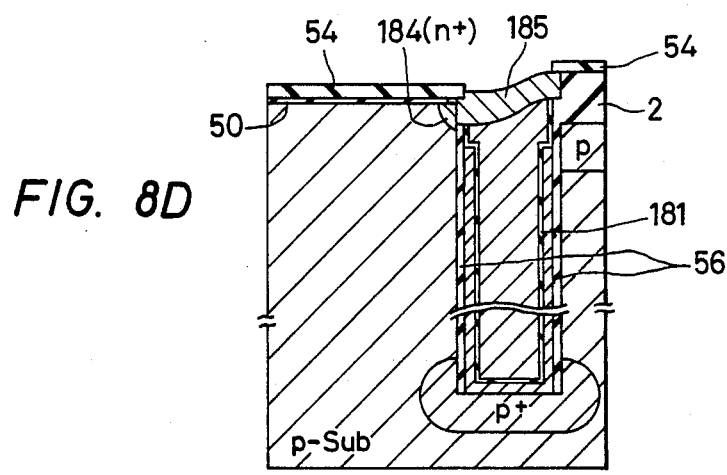
Figure 8E:
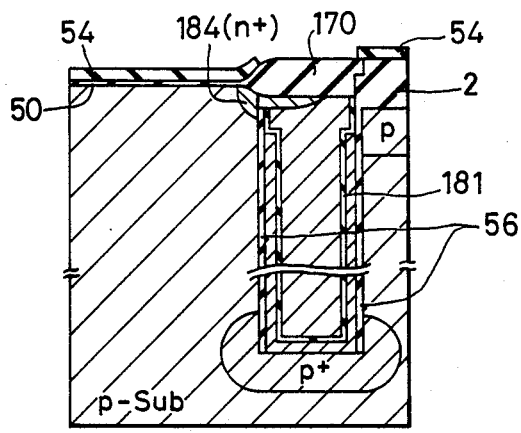
Figure 8F:
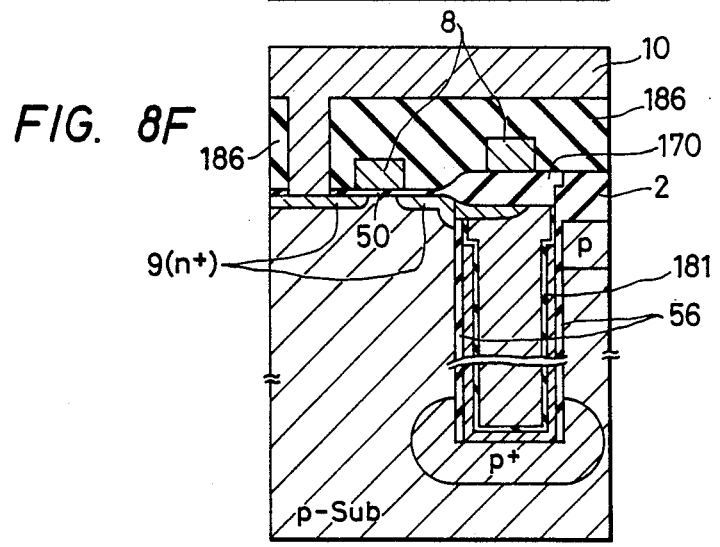

A trial-manufacture process for producing the semiconductor memory of the present embodiment will be described with reference to FIGS. 8A-8F. These figures are views illustrative of manufacturing steps which follow the state of FIG. 3E. After the structure in FIG. 3E has been formed, the whole surface is coated with a photoresist. After the coating, the photoresist on the semiconductor substrate is etched by dry etching, whereupon the photoresist is over-etched to the extent of, for example, 0.5 μm. Thus, the photoresist 180 shown in FIG. 8A is left in the groove. Polycrystalline Si is etched using as a mask the resist left in the groove, thereby to form sheath-shaped polycrystalline Si shown at numeral 57. After removing the resist in the groove, as shown in FIG. 8B, a capacitor insulator 181 is formed by oxidation, chemical vapor deposition or the like, polycrystalline Si 182 is deposited by chemical vapor deposition, and phosphorus is diffused into the polycrystalline Si 182 by vapor phase diffusion. Subsequently, the polycrystalline Si on the semiconductor substrate is etched. On that occasion, the polycrystalline Si is over-etched to the extent of, for example, 0.2 μm, whereby it is left below the the surface of the semiconductor substrate as shown in FIG. 8C. At the next step, the capacitor insulator film 181 and the silicon dioxide film 56 are etched using the polycrystalline Si as a mask, thereby to form a sidewall contact region 183. After forming the sidewall contact region, polycrystalline Si is deposited by chemical vapor deposition, phosphorus is diffused into the polycrystalline Si by vapor phase diffusion, and the polycrystalline Si on the semiconductor substrate is etched, thereby to form polycrystalline Si 185 shown in FIG. 8D. During this step, the phosphorus diffused in the polycrystalline Si is diffused into the semiconductor substrate through the sidewall contact region 183, whereby an $n^+$ impurity region 184 shown in FIG. 8D can be formed. Subsequently, using the silicon nitride film 54 as a mask, local oxidation which uses $H_2O$ gas (water vapor) is conducted to form a silicon dioxide film 170 shown in FIG. 8E. Finally, the silicon nitride film is removed, and gate electrodes 8, n+ diffused layers 9 and Al wiring 10 are formed. Then, the semiconductor memory of the embodiment of the present invention shown in FIG. 8F, namely, FIG. 7 is finished up.

Figure 4:
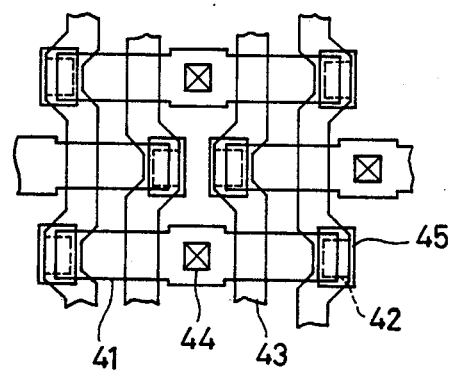
FIG. 4 and FIGS. 7 and 8A-8F are a plan view and sectional views for explaining another embodiment of the present invention, respectively.

Incidentally, FIG. 4 shows the plan layout of the present invention. Here, numeral 41 designates an insulator for isolation between elements, numeral 42 a trench, numeral 43 a gate electrode (word line), and numeral 44 a bit-line contact hole.

The present embodiment has been described assuming the folded bit line arrangement, but it is needless to say that the present invention is also applicable to memories of the open bit line arrangement.

Figure 5:
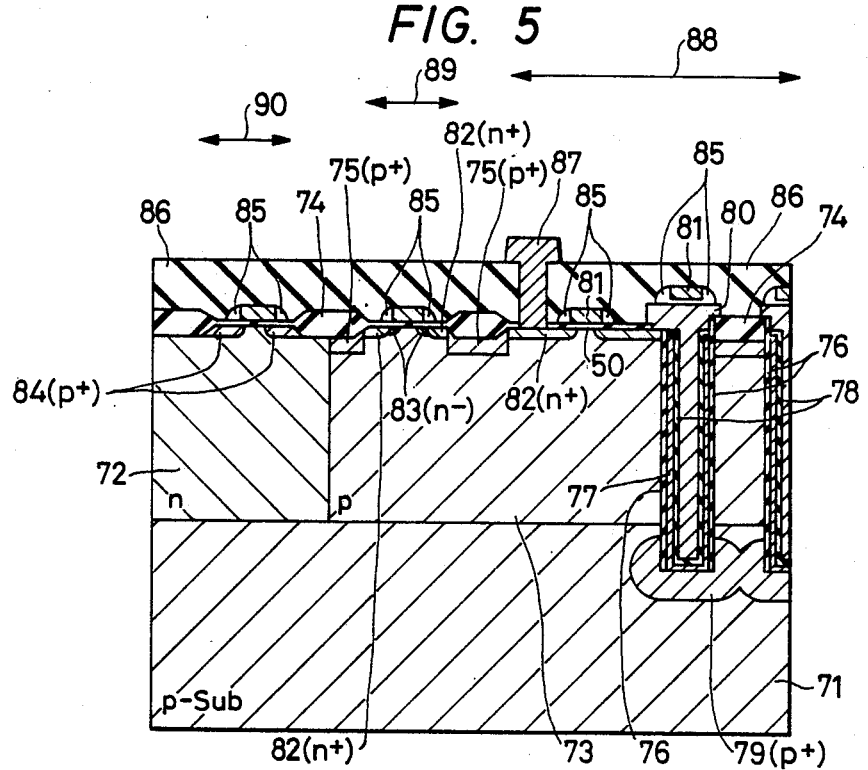
FIG. 5 is a sectional view for explaining another embodiment of the present invention.

In addition, FIG. 5 shows an example in which the present invention is applied to a CMOS LSI. Here, numeral 71 indicates a p-type Si substrate. However, in a case where, by way of example, p+ diffused layers 79 are electrically connected to each other in proximity as illustrated in the figure, the interconnected p+ diffused layers can be used a as wiring layer, so that no problem arises for a circuit operation even when the substrate 71 is an n-type Si substrate. In this case, however, electrodes must be led out from the p+ diffused layer to the surface of the substrate in at least one place within a wafer surface, by the use of wiring which utilizes a sheath electrode 77 by way of example. Numeral 72 indicates an n-type well, and numeral 73 a p-type well. Numerals 74 and 75 designate an insulator for isolation and a p+ diffused layer, respectively. Numerals 76, 77, 78 and 80 designate an insulator, the sheath electrode, a capacitor insulator and a storage electrode or node, respectively. Here, silicon dioxide, silicon nitride, tantalum oxide ($Ta_2O_5$) or a composite film of these insulators can be used as the capacitor insulator. Numeral 81 designates a gate electrode for a word line, numeral 82 an n+ diffused layer, and numeral 83 an n− diffused layer. In the present embodiment, the drain structure of an n-MOS transistor is an arsenic drain structure in a memory cell area 88 and an LDD (Lightly Doped Drain) structure in a peripheral n-MOS area. This is a measure according to which, when an LSI is brought to a higher density of integration in the future, the memory cell area greatly affecting the density of integration is operated at a lower voltage, for example, 3 V, and a transistor arrangement is simplified in correspondence with the decrease of an electric field based on the lowered voltage, thereby to enhance a transconductance. Numeral 84 denotes a p+ diffused layer, and numeral 85 a sidewall spacer of $SiO_2$ for forming an LDD. Numeral 86 denotes phosphosilicate glass, and numeral 87 Al for wiring.

Figure 6:
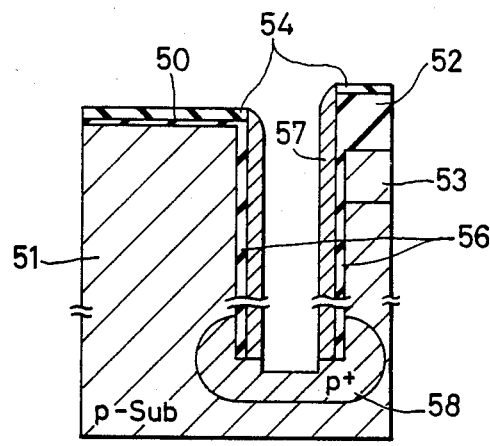
FIG. 6 is a sectional view for explaining another embodiment of the present invention.

FIG. 6 shows still another embodiment of the method of forming the sheath electrode which is the most important in the present invention. This figure illustrates a result obtained in such a way that, after the manufacturing process has proceeded to the state of FIG. 3E, the polycrystalline Si at the surface of the substrate and at the bottom of the groove is etched by anisotropic dry etching. It is to be understood that, even with the structure of this figure, the polycrystalline Si 57 is electrically continuous to the p-type silicon substrate 51 through the p+ impurity region 58 at the peripheral part of the groove bottom, so it functions as the sheath electrode effectively.

Figure 9:
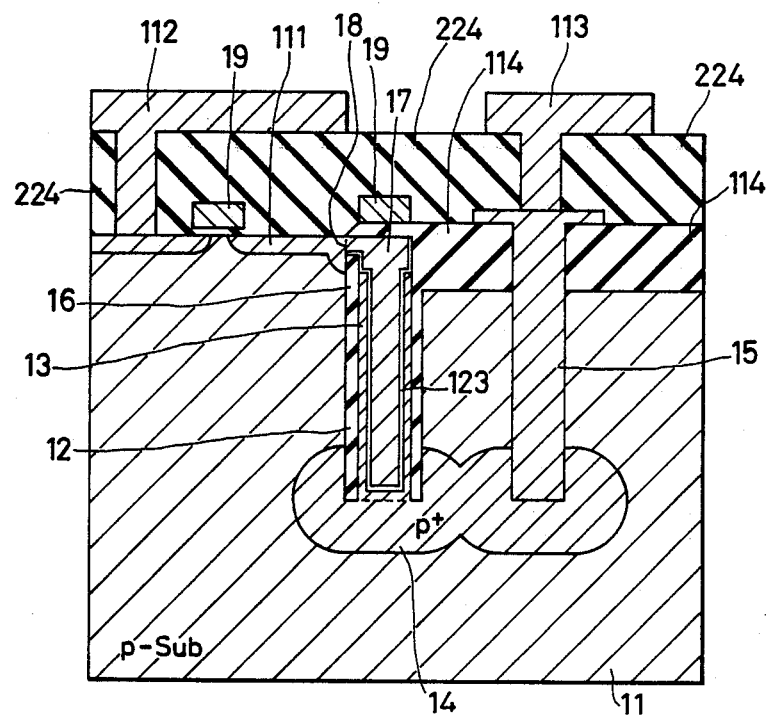
FIG. 9 and FIGS. 10A-10N are sectional views for explaining another embodiment of the present invention.

Next, another embodiment for realizing the semiconductor memory of the present invention illustrated in FIG. 9 will be described with reference to FIGS. 10A–10N.

Figure 10A:
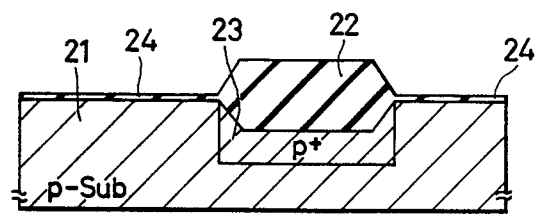

As the substrate of the semiconductor memory of the present invention, a p-type Si substrate 21 is used as shown in FIG. 10A. Of course, an n-type Si substrate can be used when employing the p-channel type MOS transistors. With the p-channel type MOS transistors, however, all of impurities to be referred to in FIGS. 10A–10N below must be replaced with impurities which are opposite in the conductivity type to the description.

Figure 10B:
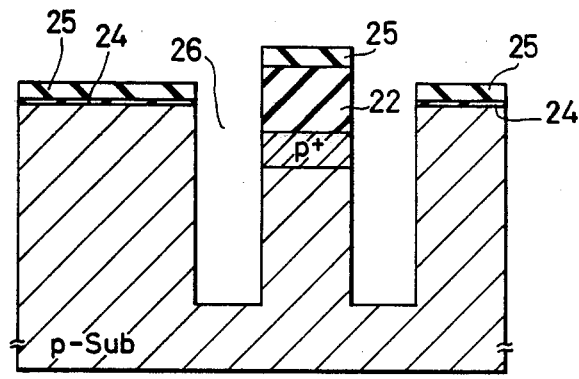

$SiO_2$ for isolation 22 is formed on the p-type Si substrate by LOCOS (LOCal Oxidation of Silicon), and a p+ diffused layer 23 is formed directly below the $SiO_2$. The $SiO_2$ for isolation is made 500 nm thick by way of example. $Si_3N_4$ 25 is deposited on the whole surface of the substrate by chemical vapor deposition, and Si grooves 26 are formed as shown in FIG. 10B by photolithography and anisotropic dry etching.

Figure 10C:
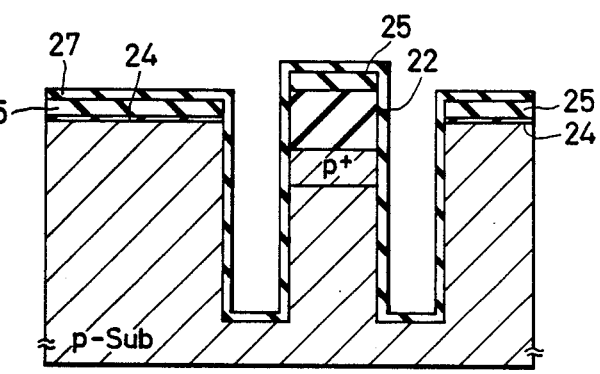

Subsequently, $SiO_2$ 27 is formed as shown in FIG. 10C by oxidation or chemical vapor deposition.

Figure 10D:
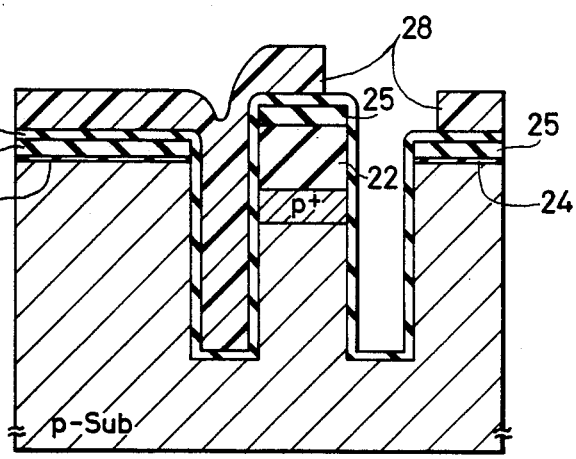

At the next step, the whole surface is coated with a resist 28, and the part (15 in FIG. 9) of the resist to finally become the lead-out electrode of a plate electrode is removed as shown in FIG. 10D by photolithography.

Figure 10E:
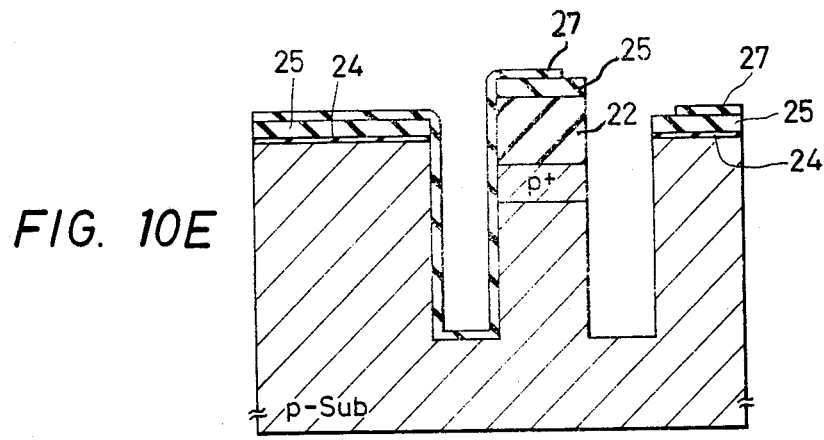

The $SiO_2$ 27 is wet-etched using the resist as a mask, and the resist is removed, whereby a configuration shown in FIG. 10E is formed.

Figure 10F:
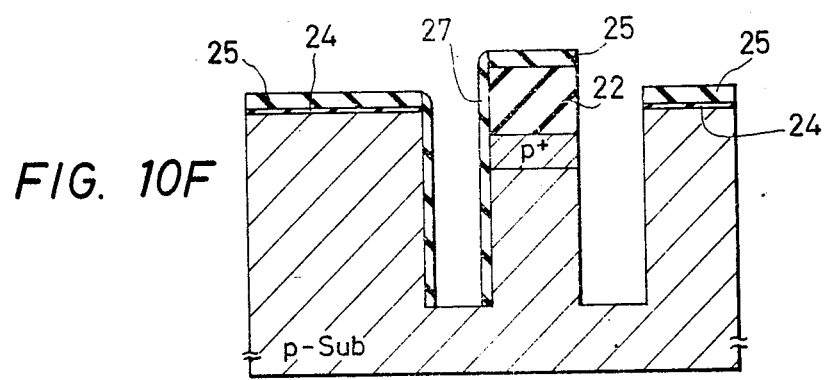

Subsequently, as shown in FIG. 10F, the $SiO_2$ 27 is etched by anisotropic dry etching so as to be left only at the sidewall of the Si groove which constitutes the capacitor of a memory cell.

Figure 10G:
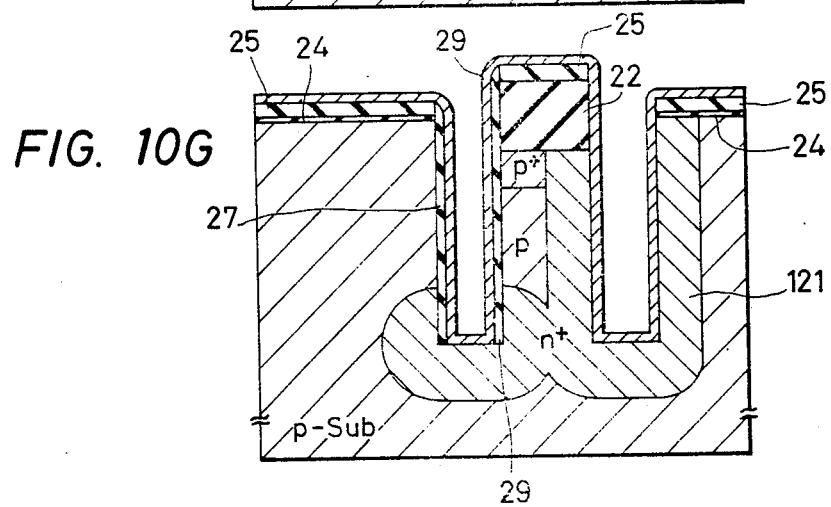

Subsequently, polycrystalline Si 29 is deposited on the whole surface by chemical vapor deposition, and phosphorus is diffused thereinto by vapor phase diffusion. Thus, as shown in FIG. 10G, n+ diffused layers 121 are formed within the substrate. By controlling the depth of the diffusion with an annealing temperature and an annealing time, the adjacent n+ diffused layers can be brought into contact as shown in FIG. 10G and used as wiring within the substrate.

Figure 10H:
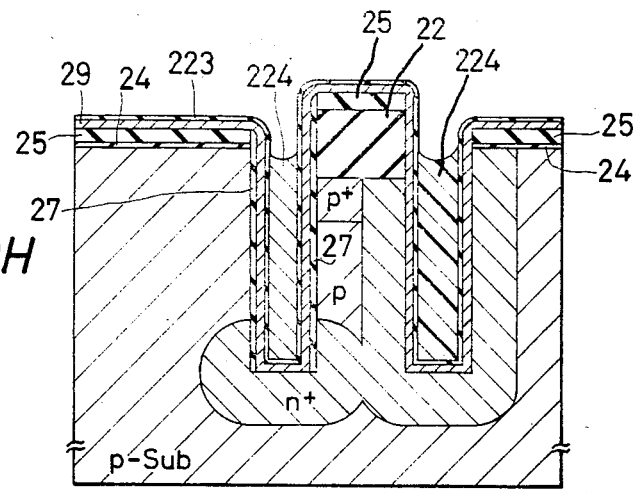

At the next step, $SiO_2$ 223 is deposited on the whole surface by chemical vapor deposition, and the grooves are filled up with a resist 224, thereby to form a configuration in FIG. 10H. As methods of filling up the grooves with the resist, there are a method in which the resist is applied on the semiconductor substrate and is thereafter exposed to light weakly so as to remove only the surface layer thereof through development, a method in which after the application of the resist, the whole surface is dry-etched so as to leave the resist only in the grooves, and so on.

Figure 10I:
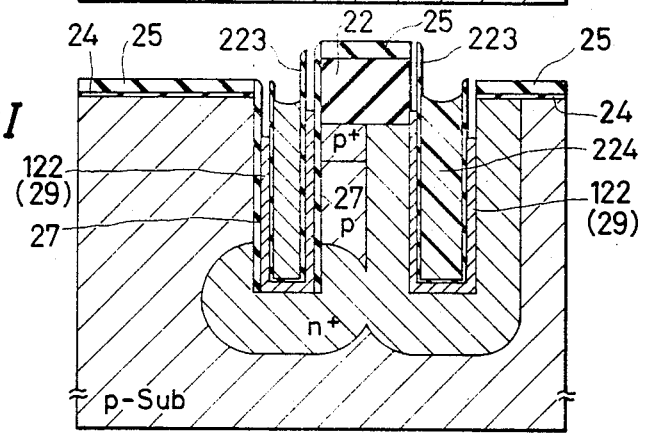

Subsequently, the $SiO_2$ 223 at the surface of the semiconductor substrate is etched by anisotropic dry etching, and the polycrystalline Si 29 is etched to form sheath-shaped polycrystalline Si 122, whereby a configuration in FIG. 10I is formed.

Figure 10J:
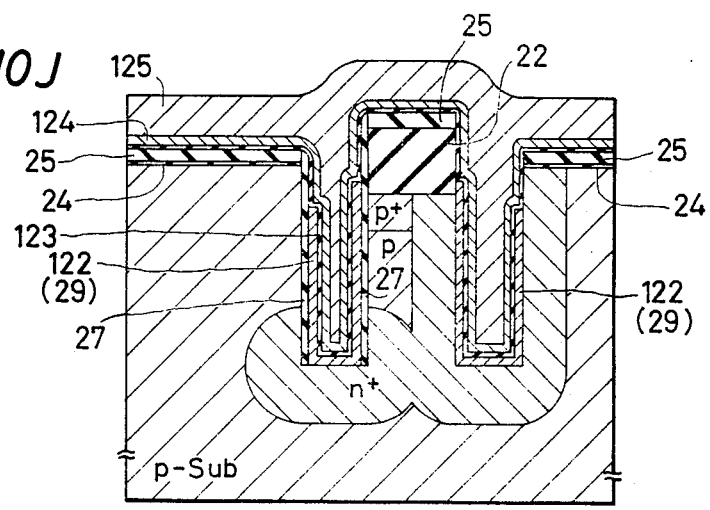

After removing the resist 224 and the $SiO_2$ 223, as shown in FIG. 10J, a capacitor insulator 123 is formed, polycrystalline Si 124 is deposited by chemical vapor deposition, phosphorus is diffused by vapor phase diffusion, and polycrystalline Si 125 is deposited by chemical vapor deposition. Usable as the capacitor insulator 123 is an insulator film which is formed by the deposition of $SiO_2$, $Si_3N_4$ or $Ta_2O_5$ based on oxidation or chemical vapor deposition, or a composite film which consists of at least two of the films of these insulators. Of course, as long as an insulator is employed, the kind thereof and a method of forming it are not especially restricted.

Figure 10K:
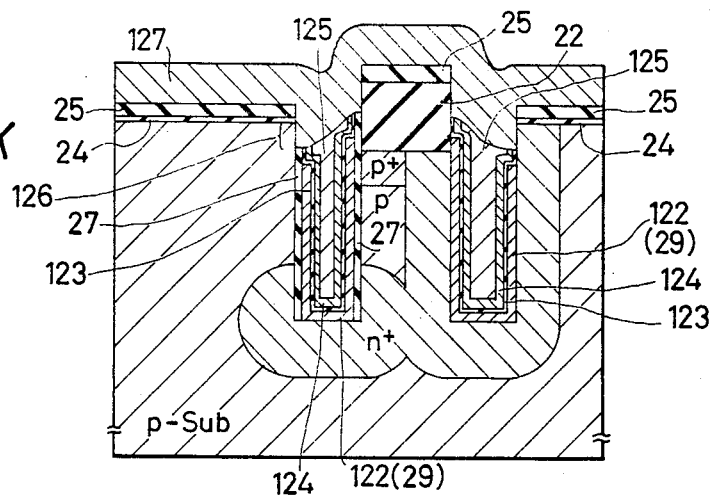

Next, the polycrystalline Si layers 124 and 125 are etched by dry etching or wet etching so as to remove the polycrystalline Si from the surface of the substrate and the top parts of the grooves. Subsequently, the capacitor insulator 123 and the $SiO_2$ 27 are etched by employing as a mask the polycrystalline Si left in the grooves, thereby to form a sidewall contact region 126, and polycrystalline Si 127 is thereafter deposited by chemical vapor deposition. Thus, a configuration in FIG. 10K is formed.

Figure 10L:
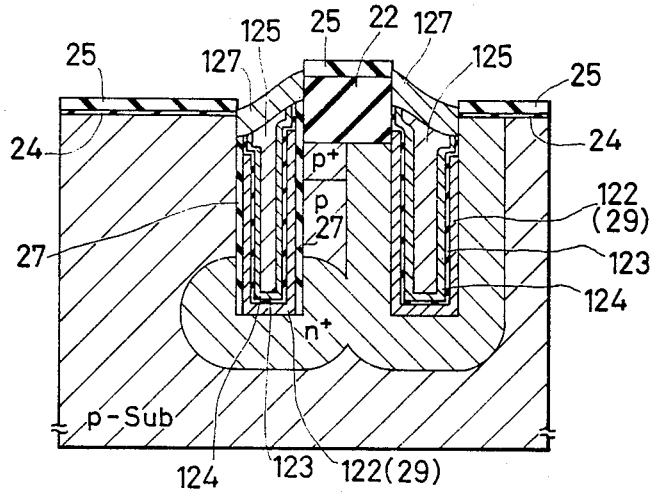

Subsequently, as shown in FIG. 10L, the polycrystalline Si 127 is removed by dry etching or wet etching so as to be left at the top parts of the grooves.

Figure 10M:
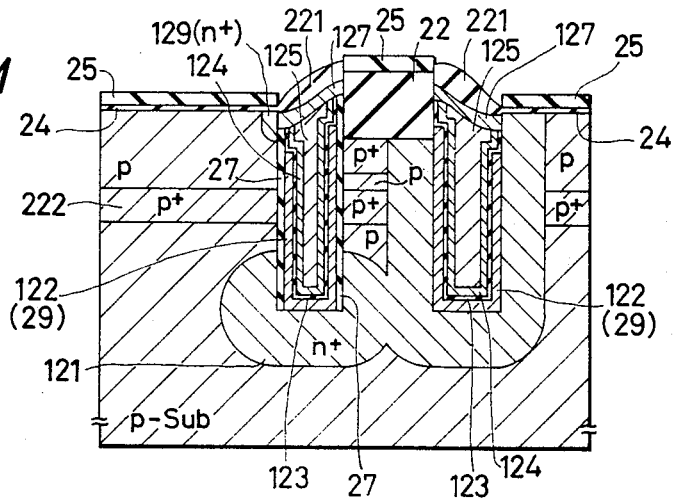
Figure 10N:
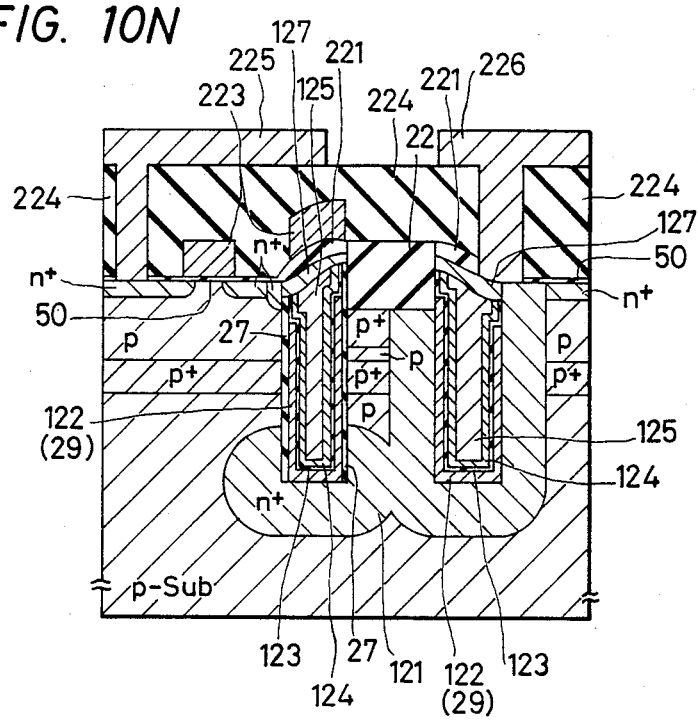

Subsequently, as shown in FIG. 10M, the polycrystalline Si at the surfaces of the grooves is oxidized to form $SiO_2$ 221 by employing as a mask the $Si_3N_4$ 25 left at the substrate surface. On this occasion, owing to an annealing effect during the oxidation or by adding an appropriate high-temperature process, the phosphorus in the polycrystalline Si 124 or 125 left in the groove is diffused to form an n+ diffused layer 129 in the sidewall contact portion. Thereafter, ions are implanted at high energy (for example, under the conditions of B+, 200 keV and $1 \times 10^{12} - 1 \times 10^{13}$ cm$^{-2}$) to form a p+ diffused layer 222 within the substrate, whereby the device is endowed with the effect of enhancing the immunity against alpha-particles. This p+ diffused layer is also effective to raise the threshold voltage of the vertical MOS transistor having the n+ diffused layer 121 as a drain, the sheath-shaped polycrystalline Si 122 as a gate $SiO_2$ 27 as a gate insulator film and to prevent this vertical MOS transistor from turning ON.

Lastly, the $Si_3N_4$ 25 is etched, and word lines 223, phosphosilicate glass 224 for passivation, a data line 225 and plate wiring 226 are formed. Then, a semiconductor memory in FIG. 10N is completed. With this semiconductor memory, the potential of the n+ diffused layer 121 formed within the substrate can be controlled at will through the plate wiring 226. Since this n+ diffused layer is electrically connected with the sheath-shaped polycrystalline Si 122 of the capacitor, the potential of the sheath-shaped polycrystalline Si 122 for the capacitor can be freely controlled by applying a potential to the plate wiring 226. By applying $\frac{1}{2} V_{cc}$ to the plate wiring, therefore, a semiconductor memory of the $\frac{1}{2} V_{cc}$ plate voltage type can be realized.

Figure 11A:
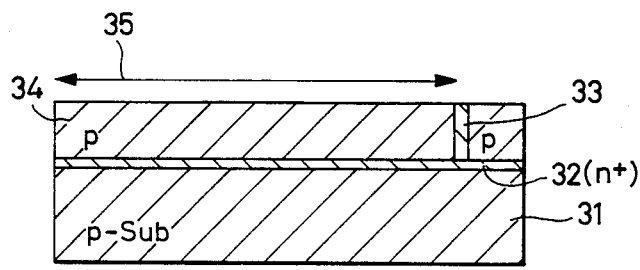
FIGS. 11A-11C are sectional views for explaining several power-feeding methods according to the present invention.
Figure 11B:
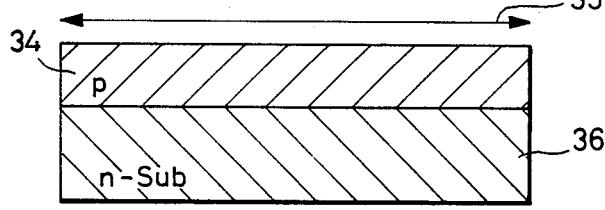
Figure 11C:
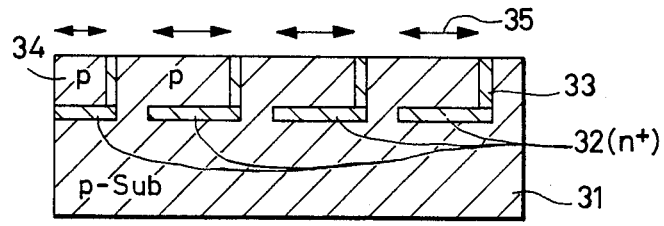

FIGS. 11A-11C show wiring structures within substrates for the $\frac{1}{2} V_{cc}$ plate voltage type.

FIG. 11A illustrates a method wherein a buried n+ diffusion layer is employed as the wiring within the substrate. In this case, the n+ diffused layer 32 is formed within the substrate over the whole memory cell area 35.

FIG. 11B illustrates a setup wherein an n-type Si substrate 36 is employed as the substrate, whereby $\frac{1}{2} V_{cc}$ can be applied from the back of the substrate.

FIG. 11C illustrates an improvement on the structure of FIG. 11A. More specifically, the structure of FIG. 11A has the problem that the potential of a p-type Si region 34 is prone to fluctuate because the p-type Si region 34 constituting a memory cell and the p-type Si substrate 31 are electrically insulated by the intervening n+ diffused layer 32. In order to solve this problem, in the setup of FIG. 11C, the memory cell area is divided into two or more sections, and each section is formed with an n+ diffused layer 32 and a lead-out electrode 33. In case of this setup, the p-type Si region 34 including each memory cell section is electrically connected with the p-type Si substrate 31, so that the potential of the p-type Si region 34 can be stabilized.

Figure 12:
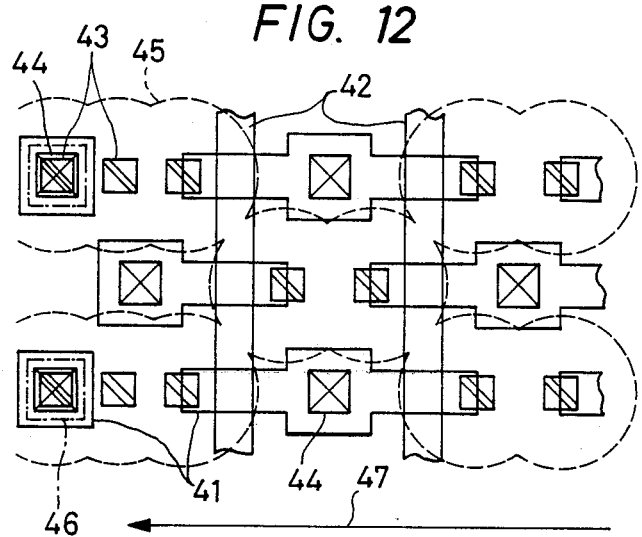
FIG. 12 is a plan view of the embodiment of the present invention shown in FIG. 9.

FIG. 12 shows the plan layout of the embodiment depicted in FIG. 9. Here, numeral 41 designates an insulator for isolating elements, numeral 42 a word electrode, numeral 43 a trench, numeral 44 a contact hole, and numeral 45 an n+ impurity region which is formed within the substrate by, for example, the diffusion of phosphorus from the bottom of the trench. The n+ impurity regions diffused from the adjacent trenches are electrically interconnected, thereby to form reticulate wiring as a whole. Numeral 46 indicates a lead-out electrode portion which is formed at an end of a memory cell region. At least one trench is inserted between the trench of the lead-out electrode portion and the trench located at the extreme end of the memory cell area, whereby the lead-out electrode portion is spaced from a memory cell, and the influence of the potential of the n+ region around a lead-out electrode on the memory cell can be eliminated (in the lead-out electrode portion, the n+ diffused layer extends, not only within the substrate, but also to the surface of the substrate).

Although the present embodiment has been described assuming the folded bit line organization, it is needless to say that the present invention is also applicable to memories of the open bit line organization.

Figure 13:
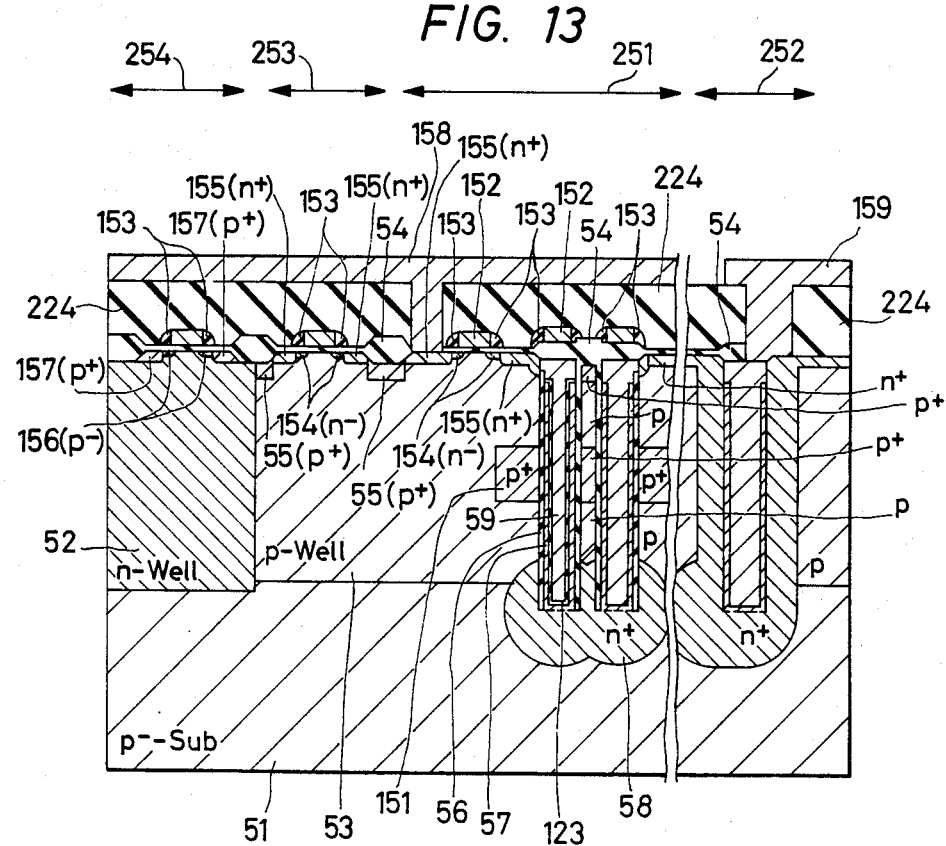
FIG. 13 is a sectional view for explaining another embodiment of the present invention.

FIG. 13 shows an example in which the present invention is applied to a CMOS type DRAM. Here, numeral 51 indicates a p-type Si substrate, numeral 52 an n-type well, and numeral 53 a p-type well. A p-channel MOS transistor 254 for a peripheral circuit is formed in the n-type well. An n-channel MOS transistor 253 for the peripheral circuit, a memory cell area 251 and a lead-out electrode area 252 are formed in the p-type well. Numeral 54 denotes $SiO_2$ for isolating elements, and numeral 55 a p+ diffused layer for isolating the elements. A memory cell has sheath-shaped $SiO_2$ 56 and polycrystalline Si 57. The sheath-shaped polycrystalline Si is electrically continuous with an n+ diffused layer 58 at the bottom of a groove, and this n+ diffused layer is electrically connected with plate wiring 159 via a plate terminal or lead-out electrode outside the memory cell area 251. In addition, a p+ diffused layer 151 is formed in the memory cell area 251 to thereby raise the threshold voltage of a vertical MOS transistor having the n+ diffused layer 58 as a drain and the sheath-shaped polycrystalline Si 57 as a gate electrode and to prevent this transistor from turning ON.

According to the present invention, a sheath electrode surrounded with an insulator is used as one electrode of a trench capacitor, and this sheath electrode is electrically continuous with a semiconductor substrate at the bottom of a groove. Therefore, a device can be formed on the low-concentration p-type semiconductor substrate without requiring a p+ semiconductor substrate or a p-type epitaxial layer of small thickness, so that an n-well and a p-well can be formed within a wafer surface. Accordingly, the invention has the effect that a CMOS type LSI can be fabricated. Further, a charge storage node or electrode is enclosed with the sheath electrode through an insulator and is insulated from the surrounding substrate substantially perfectly. Therefore, storage charges leak little between adjacent cells, and charges generated within the substrate by the cause of alpha-particles have little possibility of flowing into the charge storage electrode. Accordingly, the invention has the effect that the device is made immune against soft errors ascribable to the alpha-particles.

Moreover, according to the present invention, a so-called "half $V_{cc}$ type cell" can be realized in which even a cell for DRAM having a trench capacitor is operated by applying $\frac{1}{2}$ $V_{cc}$ to the plate electrode of a capacitor. Owing to the realization of the half $V_{cc}$ type cell, an electric field acting on a capacitor insulator can be reduced to half of an electric field on a conventional $V_{ss}$ plate (grounded potential plate) or $V_{cc}$ plate. This brings forth the effect that the lifetime of the capacitor insulator can be greatly prolonged, and the effect that when the electric field is held the same as in the prior art, the thickness of the insulator can be reduced to $\frac{1}{2}$ of the thickness in the prior art, so the capacitance of the capacitor can be increased to about two times the capacitance in the prior art.

It is further understood by those skilled in the art that the foregoing description is of the preferred embodiments of the disclosed devices and that various changes and modifications may be made in the invention without departing from the spirit and scope thereof.

What is claimed is:

1. A semiconductor memory comprising memory cells each of which is constructed of a trench type charge storage capacitor formed within a semiconductor substrate of a first conductivity type, a switching transistor, and a heavily doped embedded impurity region formed at the bottom of said trench capacitor and within said semiconductor substrate, and wherein each trench capacitor is comprised of:

a first capacitor electrode including a sheath-shaped structure having a bottom portion which is electrically connected with the semiconductor substrate via said heavily doped embedded impurity region and which has a sideward periphery covered with an insulator film thereby forming an insulator barrier with said semiconductor substrate and a second capacitor electrode having a part which is buried inside said sheath-shaped first electrode through a dielectric film of said capacitor and another part which is electrically connected with an impurity doped layer of a second conductivity type opposite to said first conductivity type formed in a surface region of said semiconductor substrate to function as one of a source and drain regions of said transistor.

2. A semiconductor memory according to claim 1, wherein a portion for the electrical connection between said second capacitor electrode and one of said source and drain regions of said transistor exists at an inner part of said substrate below a surface of said substrate, and a surface of said trench capacitor is covered with an insulator produced by oxidizing or nitriding the second electrode of said capacitor.

3. A semiconductor memory according to claim 1, further comprising a CMOS peripheral circuit, a p-channel MOS transistor of which is formed in an n-well region and an n-channel MOS transistor of which is formed in a p-well region.

4. A semiconductor memory according to claim 1, wherein said sheath-shaped first electrode is made of polycrystalline silicon.

5. A semiconductor memory according to claim 1, wherein at least a part of said heavily doped region which is within said substrate is led out to a front surface of said substrate or a rear surface thereof.

6. A semiconductor memory comprising memory cells, each of which is constructed of a trench type charge storage capacitor formed within a semiconductor substrate of a first conductivity type, a switching transistor, and a heavily doped region of a second conductivity type, opposite said first conductivity type, which is formed within said semiconductor substrate and which has a doping concentration greater than that in said semiconductor substrate, and wherein in each memory cell the charge storage capacitor is comprised of:

a first electrode of said capacitor which has a sheath-shaped structure formed in a groove which is provided in a surface region of said semiconductor substrate and which is electrically connected in a bottom portion thereof with said heavily doped region, said first electrode of a sheath-shaped structure having a periphery which is covered with an insulator film except for the electrically connected part with said heavily doped region;

a second electrode of said capacitor having a part which is buried inside said first sheath-shaped electrode through a dielectric film of said capacitor and another part which is electrically connected with an impurity doped layer of said second conductivity type formed in a surface region of said semiconductor substrate to function as one of a source and drain regions of said switching transistor; and a highly-doped diffused layer of said first conductivity type embedded in said semiconductor substrate between the surface thereof and said heavily doped region and formed so as to be in contact with a portion of said insulator film such that an unwanted vertical MOS transistor effected by said heavily doped region and said first sheath-shaped electrode, acting as a drain and gate, respectively, would be prevented from switching to an on condition.

7. A semiconductor memory according to claim 6, wherein a portion for the electrical connection between said second electrode of said capacitor and one of said source and drain regions of said transistor exists at an inner part of said substrate below a surface of said substrate, and a surface of said trench capacitor is covered with an insulator produced by oxidizing or nitriding the second electrode of said capacitor.

8. A semiconductor memory according to claim 6, further comprising a CMOS peripheral circuit, a p-channel MOS transistor of which is formed in an n-well region and an n-channel MOS transistor of which is formed in a p-well region.

9. A semiconductor memory according to claim 6, wherein said first sheath-shaped capacitor electrode is made of polycrystalline silicon.

10. A semiconductor memory according to claim 6, wherein a voltage of $\frac{1}{2}$ $V_{cc}$ is applied to said heavily doped region within said substrate, whereby said sheath electrode is operated as a $\frac{1}{2}$ $V_{cc}$ plate electrode.

11. A semiconductor memory according to claim 8, wherein a portion for the electrical connection between said second electrode of said capacitor and one of said source and drain regions of said transistor exists at an inner part of said substrate below a surface of said substrate, and a surface of said trench capacitor is covered with an insulator produced by oxidizing or nitriding the second electrode of said capacitor.

12. A semiconductor memory according to claim 6, wherein in at least one of said memory cells the sheath-shaped electrode is led out to a surface of said substrate, so that a voltage can be applied to said heavily doped region within said substrate through the lead-out electrode.

13. A semiconductor memory according to claim 6, wherein at least a part of said heavily doped region within said substrate is led out to a front surface of said substrate or a rear surface thereof.

14. A semiconductor memory according to claim 6, wherein said heavily doped region is an impurity layer which is formed within said semiconductor substrate in at least a part of the surrounding region below said groove.

15. A dynamic random access memory comprising memory cells, each having a MOS transfer switch in series with a trench type charge storage capacitor which is formed in a semiconductor substrate of a first conductivity type in a groove region thereof having a bottom portion in electrical contact with a heavily doped embedded region, said capacitor including a first electrode having a sheath-shaped structure of a predetermined thickness which is vertically formed in said groove provided in a main surface region of said semiconductor substrate, said sheath-shaped structure having a bottom portion which is electrically connected with said heavily doped embedded region and having a periphery which is covered with an insulator film except for the portion in electrical contact with said heavily doped embedded region, and a second electrode having a first part formed in said groove inside said sheath-shaped electrode and separated therefrom by a dielectric film of said capacitor and a second part which is electrically connected with one of a pair of impurity doped regions of a second conductivity type opposite to said first conductivity type formed in a surface region of said semiconductor substrate which functions as a source region of a memory cell MOS switching transistor.

16. A dynamic random access memory according to claim 15, wherein said semiconductor substrate has a doping concentration which is lower than that in said heavily doped region.

17. A dynamic random access memory according to claim 16, wherein said heavily doped embedded region is of said first conductivity type.

18. A dynamic random access memory according to claim 17, further including a lead-out electrode of said capacitor first electrode vertically formed in said semiconductor substrate near said main surface region so as to facilitate contact between said heavily-doped embedded region and a lead wire surface layer, said lead-out electrode extending into the semiconductor substrate to a depth corresponding to that of said sheath-shaped structure.

19. A semiconductor memory according to claim 15, wherein a portion for the electrical connection between said second electrode of the capacitor and said source region of said transistor exists at an inner part of said substrate below a surface of said substrate, and a surface of said trench capacitor is covered with an insulator produced by oxidizing or nitriding the second electrode of said capacitor.

20. A dynamic random access memory comprising memory cells, each having a MOS transfer switch in series with a trench type charge storage capacitor which is formed in a semiconductor substrate of a first conductivity type in a groove region thereof having a bottom portion in electrical contact with a heavily doped embedded region having greater doping concentration than that of said semiconductor substrate and of a second conductivity type, opposite said first conductivity type, said capacitor including:

a first electrode having a sheath-shaped structure of a predetermined thickness which is vertically formed in said groove provided in a main surface region of said semiconductor substrate, said sheath-shaped structure having a bottom portion which is electrically connected with said heavily doped embedded region and having a periphery which is covered with an insulator film except for the portion in electrical contact with said heavily doped embedded region;

a second electrode having a first part formed in said groove inside said sheath-shaped electrode and separated therefrom by a dielectric film of said capacitor and a second part which is electrically connected with one of a pair of impurity doped regions of said second conductivity type formed in a main surface region of said semiconductor substrate which functions as a source region of a memory cell MOS switching transistor;

a lead-out electrode of said capacitor first electrode which is vertically formed in said semiconductor substrate near said main surface region so as to facilitate contact between said heavily-doped embedded region and a lead wire surface layer, said lead-out electrode extending into the semiconductor substrate to a depth corresponding to that of said sheath-shaped structure; and a highly doped diffused layer of said first conductivity type embedded in said semiconductor substrate between the surface thereof and said heavily doped embedded region and formed so as to be in contact with a portion of said insulator film such that an unwanted vertical MOS transistor effected by said heavily doped region and said first electrode, acting as a drain and gate, respectively, would be prevented from switching to an on condition.

21. A semiconductor memory according to claim 20, wherein a voltage of $\frac{1}{2} V_{cc}$ is applied to said heavily doped region within said substrate, whereby said sheath-shaped electrode is operated as a $\frac{1}{2} V_{cc}$ plate electrode.

22. A semiconductor memory comprising memory cells each of which is constructed of a trench type charge storage capacitor formed within a semiconductor substrate of a first conductivity type, a switching transistor, and a heavily doped embedded region which is formed at the bottom of said trench capacitor and within said semiconductor substrate and wherein each trench capacitor is comprised of:

a first capacitor electrode including a sheath-shaped structure which is formed in a groove provided in said semiconductor substrate through a principal surface thereof, said sheath-shaped structure having a bottom portion which is electrically connected with said heavily doped embedded region, and a sideward periphery which is covered with an insulator film which forms an insulator barrier with said semiconductor substrate; and a second capacitor electrode including a part which is buried inside the sheath-shaped first capacitor electrode through a dielectric film of said capacitor and another part which is electrically connected with an impurity doped layer of a second conductivity type, opposite to said first conductivity type, formed in a surface region of said semiconductor substrate near said principal surface to function as one of a source and drain regions of said switching transistor.

23. A semiconductor memory according to claim 22, wherein a voltage of ½ $V_{cc}$ is applied to said heavily doped region within said substrate, whereby said sheath-shaped first electrode is operated as a ½ $V_{cc}$ plate electrode.

24. A semiconductor memory according to claim 22, wherein in at least one of said memory cells the sheath-shaped electrode is led out to a principal surface of said substrate, so that a voltage can be applied to said heavily doped region within said substrate through the lead-out electrode.

25. A semiconductor memory according to claim 22, wherein said heavily doped embedded region is of the second conductivity type; and wherein there is further included an impurity layer of the first conductivity type which is formed within said semiconductor substrate in at least a part of a surrounding region of said groove between said bottom portion of said sheath-shaped structure and said surface region of said semiconductor substrate.

* * * * *